(12) United States Patent
Asano

(10) Patent No.: US 7,531,778 B2
(45) Date of Patent: May 12, 2009

(54) NANO TUBE PHOTO DETECTING DEVICE

(75) Inventor: Hideki Asano, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 265 days.

(21) Appl. No.: 11/521,500

(22) Filed: Sep. 15, 2006

(65) Prior Publication Data

US 2007/0057144 A1    Mar. 15, 2007

(30) Foreign Application Priority Data

Sep. 15, 2005    (JP) .............................. 2005-267891

(51) Int. Cl.
*H01J 40/14*    (2006.01)
(52) U.S. Cl. ..................................... 250/207
(58) Field of Classification Search .................. 250/207
See application file for complete search history.

(56) References Cited

U.S. PATENT DOCUMENTS 5,153,422 A * 10/1992 Kishida ..................... 250/208.1

6,972,467 B2 * 12/2005 Zhang et al. ................. 257/401

FOREIGN PATENT DOCUMENTS

| JP | 5-29647 A | 2/1993 |
| JP | 6-104477 A | 4/1994 |
| JP | 6-260674 A | 9/1994 |
| JP | 11-17208 A | 1/1999 |

* cited by examiner

*Primary Examiner*—Seung C Sohn
(74) *Attorney, Agent, or Firm*—Sughrue Mion, PLLC

(57) ABSTRACT

A photo detecting device comprises a photo-electron generating body, which absorbs light and generates photo-electrons, and a transistor, across which an electric current flows in accordance with a quantity of the photo-electrons having been generated by the photo-electron generating body. An electrical insulator is formed on a surface of the photo-electron generating body. The transistor is provided with a source electrode and a drain electrode, which are formed on the electrical insulator having been formed on the surface of the photo-electron generating body. The source electrode and the drain electrode of the transistor are connected with each other via a channel section containing a nano-tube having electrically conductive or semi-conductive characteristics.

12 Claims, 2 Drawing Sheets

NANO TUBE PHOTO DETECTING DEVICE

BACKGROUND OF THE INVENTION

1. Field of the Invention

This invention relates to a photo detecting device comprising a photo-electron generating body, which absorbs light and generates photo-electrons, and a transistor, across which an electric current flows in accordance with a quantity of the photo-electrons having been generated by the photo-electron generating body.

2. Description of the Related Art

As photo detecting devices for converting light into electric currents and thereby detecting the light, photodiodes have heretofore been used widely. There have also been widely used phototransistors for amplifying photo-electrons by use of transistors and detecting the amplified photo-electrons. (The phototransistors are proposed in, for example, Japanese Unexamined Patent Publication Nos. 6(1994)-104477, 6(1994)-260674, and 11(1999)-017208.) However, nowadays there is a strong demand for a photo detecting device having an enhanced sensitivity in use applications, such as photo detection in long-distance optical communication, and detection of weak light in biochemical fields.

In view of the above circumstances, a photomultiplier for amplifying the photo-electrons by use of a vacuum tube has been proposed. There has also been proposed an avalanche photodiode (APD) for amplifying the photo-electrons by use of an avalanche multiplying layer and detecting the amplified photo-electrons. (The APD is proposed in, for example, Japanese Unexamined Patent Publication No. 5(1993)-029647.) It has been reported that the photomultiplier and the APD have large effects of amplifying the photo-electrons and yield larger photo-currents than with the conventional photodiodes and the conventional phototransistors.

However, with the photomultiplier, wherein the vacuum tube is utilized, the problems are encountered in that the stability with the passage of time is not capable of being kept good, and in that a sufficient quantum efficiency is not always capable of being kept. Also, in the fields of image sensors, biochemical analyses, and the like, it is desired that the photo detecting device is capable of being formed so as to have a two-dimensional array structure, and independent detecting operations are capable of being performed with respect to incident light impinging upon different sites. However, with the photomultiplier utilizing the vacuum tube, marked limitation is imposed upon the shape of the photomultiplier, and therefore the photomultiplier is not always capable of coping with the formation of the two-dimensional array structure.

The APD is capable of coping with the formation of the two-dimensional array structure. However, with the APD, the problems are encountered in that a signal-to-noise ratio is not capable of being kept high due to large dark current, and in that an accuracy, with which weak light is detected, is limited to a certain level. Accordingly, there is a strong demand for a photo detecting device having an enhanced sensitivity.

SUMMARY OF THE INVENTION

The primary object of the present invention is to provide a photo detecting device, which has a high sensitivity, which is capable of detecting weak light with a high accuracy, and which is capable of coping with formation of a two-dimensional array structure.

The present invention provides a photo detecting device, comprising:

i) a photo-electron generating body, which absorbs light and generates photo-electrons, and ii) a transistor, across which an electric current flows in accordance with a quantity of the photo-electrons having been generated by the photo-electron generating body, an electrical insulator being formed on a surface of the photo-electron generating body, the transistor being provided with a source electrode and a drain electrode, which are formed on the electrical insulator having been formed on the surface of the photo-electron generating body, the source electrode and the drain electrode of the transistor being connected with each other via a channel section containing a nano-tube having electrically conductive or semi-conductive characteristics.

The nano-tube employed in the photo detecting device in accordance with the present invention may be a tube, which has a diameter falling within the range of 1 nm to 100 nm and which is constituted of a network of carbon atoms, or the like, having a regular annular structure.

The photo detecting device in accordance with the present invention should preferably be modified such that the photo-electron generating body is constituted of a semiconductor laminate structure body having a structure selected from the group consisting of a pn junction structure, a pin junction structure, a multiple quantum well structure, and a quantum dot structure.

Also, the photo detecting device in accordance with the present invention should preferably be modified such that the nano-tube constituting the channel section contains at least one kind of substance selected from the group consisting of carbon, boronnitride, and silicon. The channel section may contain at least one kind of the nano-tube as described above.

The photo detecting device in accordance with the present invention comprises the photo-electron generating body, which absorbs the light and generates the photo-electrons, and the transistor, across which the electric current flows in accordance with the quantity of the photo-electrons having been generated by the photo-electron generating body. The source electrode and the drain electrode of the transistor are connected with each other via the channel section containing the nano-tube having the electrically conductive or semi-conductive characteristics.

With the photo detecting device in accordance with the present invention, a photo-current, which is larger than the photo-current obtainable with the avalanche photodiode (the APD), is capable of being obtained. The photo detecting device in accordance with the present invention has a high sensitivity and is capable of accurately detecting weak light, which could not be detected with the conventional techniques. The photo detecting device in accordance with the present invention has the advantages over the photomultiplier, which utilizes the vacuum tube, in that the photo detecting device is capable of coping with the formation of the two-dimensional array structure.

DESCRIPTION OF THE PREFERRED EMBODIMENT

First Embodiment

Figure 1:
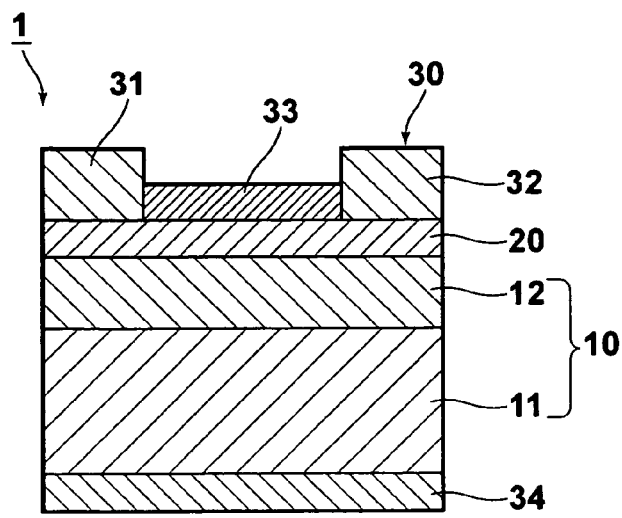
FIG. 1 is a sectional view showing a first embodiment of the photo detecting device in accordance with the present invention.

A structure of a first embodiment of the photo detecting device in accordance with the present invention will be described herein below with reference to FIG. 1. FIG. 1 is a sectional view showing a first embodiment of the photo detecting device in accordance with the present invention, the view being taken in a thickness direction of the photo detecting device.

A photo detecting device 1, which is the first embodiment of the photo detecting device in accordance with the present invention, comprises a photo-electron generating body 10, which absorbs light and generates photo-electrons. The photo detecting device 1 also comprises a transistor 30, across which an electric current flows in accordance with the quantity of the photo-electrons having been generated by the photo-electron generating body 10.

The photo-electron generating body 10 is constituted of a semiconductor laminate structure body having a pn junction structure. The photo-electron generating body 10 comprises a p-Si base plate 11 and an n-Si film 12, which is formed approximately on the entire area of the surface of the p-Si base plate 11.

A dopant in the p-Si base plate 11 may be B, or the like. A dopant concentration in the p-Si base plate 11 should preferably fall within the range of, for example, $3 \times 10^{16}$ cm$^{-3}$ to $1 \times 10^{18}$ cm$^{-3}$. The p-Si base plate 11 may have a thickness falling within the range of, for example, 10 µm to 100 µm.

The dopant in the n-Si film 12 may be P, N, or the like. The dopant concentration in the n-Si film 12 should preferably fall within the range of, for example, $3 \times 10^{16}$ cm$^{-3}$ to $7 \times 10^{17}$ cm$^{-3}$. The n-Si film 12 may have a thickness falling within the range of, for example, 10 nm to 1,000 nm. The n-Si film 12 may be formed with a CVD technique, a sputtering technique, or the like.

The p-type and n-type semiconductor materials constituting the pn junction structure are not limited to Si and may be selected from Ge, GaAs, InP, InGaAsP, InGaAs, GaN, InAs, InSb, PbS, PbSe, HgcdTe, ZnO, AnSe, and the like.

An electrical insulator 20 is overlaid on approximately the entire area of the surface of the n-Si film 12. The electrical insulator 20 may be constituted of an SiO$_2$ film, an SiN film, an SiON film, an Al$_2$O$_3$ film, or the like. The thickness of the electrical insulator 20 should preferably fall within the range of, for example, 10 nm to 200 nm. The electrical insulator 20 may be formed with the CVD technique, the sputtering technique, or the like.

The transistor 30 is provided with a source electrode 31 and a drain electrode 32, which are formed at a spacing from each other on the electrical insulator 20. The source electrode 31 and the drain electrode 32 are connected with each other via a channel section 33, which is constituted of a nano-tube having electrically conductive or semi-conductive characteristics.

FIG. 1 shows the cases wherein the source electrode 31, the channel section 33, and the drain electrode 32 are formed on the electrical insulator 20, such that no space may be left among the source electrode 31, the channel section 33, and the drain electrode 32, and such that the source electrode 31, the channel section 33, and the drain electrode 32 may not overlap one another. Alternatively, a part of the source electrode 31 and a part of the channel section 33 may overlap each other, such that the part of the channel section 33 may be located under the part of the source electrode 31. Also, a part of the channel section 33 and a part of the drain electrode 32 may overlap each other, such that the part of the channel section 33 may be located under the part of the drain electrode 32.

The transistor 30 having the constitution described above may be formed in the manner described below. Specifically, for example, at least one nano-tube having the electrically conductive or semi-conductive characteristics may be prepared and may then be located at a predetermined position on the surface of the electrical insulator 20 by being seen by use of an interatomic force microscope. Thereafter, the source electrode 31 and the drain electrode 32 may be formed in a predetermined pattern by use of a known technique. Alternatively, the channel section 33 may be formed after the source electrode 31 and the drain electrode 32 have been formed in the predetermined pattern. The nano-tube should preferably be secured to the electrical insulator 20 by solder fusion bonding, or the like.

No limitation is imposed upon the material constituting the nano-tube having the electrically conductive or semi-conductive characteristics. By way of example, the nano-tube may contain at least one kind of substance selected from the group consisting of carbon, boronnitride, and silicon. Specifically, the nano-tube may be a carbon nano-tube, a boron nitride nano-tube, a nano-tube constituted of a carbon/boron nitride composite material, a silicon nano-tube, or the like.

The nano-tube may be produced with an arcing technique, a plasma enhanced CVD technique, or the like. The nano-tube may be produced by use of a desired technique and used. Alternatively, a commercially available nano-tube may be employed as the aforesaid nano-tube.

The nano-tube constituting the channel section 33 maybe located in one of various forms, such that the source electrode 31 and the drain electrode 32 are capable of being electrically connected with each other. Examples of the forms of the channel section 33 include (1) a form in which a single nano-tube is located so as to form a bridge across the source electrode 31 and the drain electrode 32, (2) a form in which a plurality of nano-tubes are located such that each of the nano-tubes may form a bridge across the source electrode 31 and the drain electrode 32 (the plurality of the nano-tubes may be bundled together or may be separated at spacings from one another), and (3) a form in which a plurality of nano-tubes are located between the source electrode 31 and the drain electrode 32 such that the nano-tubes may overlap one another in a regular pattern or a random pattern, e.g. in a net-like pattern. The channel section 33 may contain a material other than the nano-tube, such that the entire channel section 33 is capable of having sufficient electrical conducting characteristics.

In cases where the plurality of the nano-tubes are utilized, the electrical conducting characteristics are capable of being enhanced, and therefore the photo detecting device 1 having an enhanced sensitivity is capable of being obtained. Accordingly, the photo detecting device 1 should preferably be provided with the plurality of the nano-tubes. Also, in cases where the plurality of the nano-tubes are located in the random pattern, an accurate locating operation, such as the operation for locating the nano-tubes through observation with the interatomic force microscope, need not be performed, and therefore the mass production efficiency of the photo detecting device 1 is capable of being kept high.

The electrode material for the source electrode 31 and the electrode material for the drain electrode 32 may be identical with each other. Alternatively, the electrode material for the source electrode 31 and the electrode material for the drain electrode 32 may be different from each other. As the electrode material for the source electrode 31 and the electrode material for the drain electrode 32, it is possible of utilize an SiC/Au composite material, a Ti/Pt/Au composite material, and the like.

In this embodiment, a gate electrode 34 is formedon approximately the entire area of a back surface of the p-Si base plate 11. The gate electrode 34 is a constituent element of the transistor 30. The gate electrode 34 may be constituted of a Ti/Pt/Au composite material, or the like.

This embodiment of the photo detecting device 1 is constituted in the manner described above.

This embodiment of the photo detecting device 1 is located such that light impinges upon the photo detecting device 1 from the bottom side in FIG. 1 (i.e., from the side of the gate electrode 34). In this embodiment of the photo detecting device 1, a quantity of the photo-electrons, which quantity is proportional to the intensity of the incident light, are generated in the photo-electron generating body 10. An electric current having an intensity proportional to the quantity of the photo-electrons having thus been generated flows across the transistor 30.

With the photo detecting device 1, the electric current flows across the transistor 30 with a high sensitivity with respect to a minute quantity of the photo-electrons having been generated. Therefore, weak light is capable of being detected with a high accuracy. The inventors have found that the photo detecting device 1 is a high-sensitivity photo detecting device, which is capable of yielding a photo-current larger than the photo-current obtainable with the avalanche photodiode (the APD) and which is capable of accurately detecting weak current that could not been detected with conventional photo detecting devices. (With respect to the effects of the photo detecting device 1, reference may be made to Example 1, which will be described later.)

Though a mechanism is not necessarily clear, it is presumed that, in cases where the light impinges upon the pn junction surface (i.e., the interface between the p-Si base plate 11 and the n-Si film 12) of the photo-electron generating body 10 constituted of the semiconductor laminate structure body having the pn junction structure, the photo-electrons will be generated in the photo-electron generating body 10, and an alteration will occur with an electric potential of the photo-electron generating body 10. It is also presumed that, in accordance with the alteration of the electric potential of the photo-electron generating body 10, an alteration will occur with the electric characteristics of the channel section 33 constituted of the nano-tube having the electrically conductive or semi-conductive characteristics, which channel section 33 has been formed on the electrical insulator 20 having been formed on the surface of the photo-electron generating body 10. As a result, the electric current will presumably flows from the source electrode 31 to the drain electrode 32.

Ordinarily, in the cases of transistors, a channel section is constituted of an Si semiconductor layer. However, in this embodiment of the photo detecting device 1, the channel section 33 is constituted of the nano-tube having the electrically conductive or semi-conductive characteristics. Therefore, with this embodiment of the photo detecting device 1, the electric conducting characteristics of the channel section 33 are good. Accordingly, it is presumed that the transistor 30 will be capable of responding with a high accuracy to a minute alteration of the electric potential of the photo-electron generating body 10, and weak light will be capable of being detected with a high accuracy.

The photo detecting device 1 need not necessarily be provided with the gate electrode 34. However, in cases where the photo detecting device 1 is provided with the gate electrode 34, and a bias current is caused to flow across the source electrode 31, the drain electrode 32, and the gate electrode 34, the photo detection is capable of being performed with a sensitivity enhanced even further.

This embodiment of the photo detecting device 1 comprises the photo-electron generating body 10 having the pn junction structure, which photo-electron generating body 10 absorbs the light and generates the photo-electrons. This embodiment of the photo detecting device 1 also comprises the transistor 30, across which the electric current flows in accordance with the quantity of the photo-electrons having been generated by the photo-electron generating body 10. The source electrode 31 and the drain electrode 32 of the transistor 30 are connected with each other via the channel section 33 containing the nano-tube having the electrically conductive or semi-conductive characteristics.

As described above, with this embodiment of the photo detecting device 1, a photo-current, which is larger than the photo-current obtainable with the avalanche photodiode (the APD), is capable of being obtained. This embodiment of the photo detecting device 1 has a high sensitivity and is capable of accurately detecting weak light, which could not be detected with the conventional techniques.

This embodiment of the photo detecting device 1 has the advantages over the photomultiplier, which utilizes the vacuum tube, in that the photo detecting device 1 has a high flexibility of the designing of the constituent layers and the electrodes and is capable of coping with the formation of the two-dimensional array structure.

Figure 2:
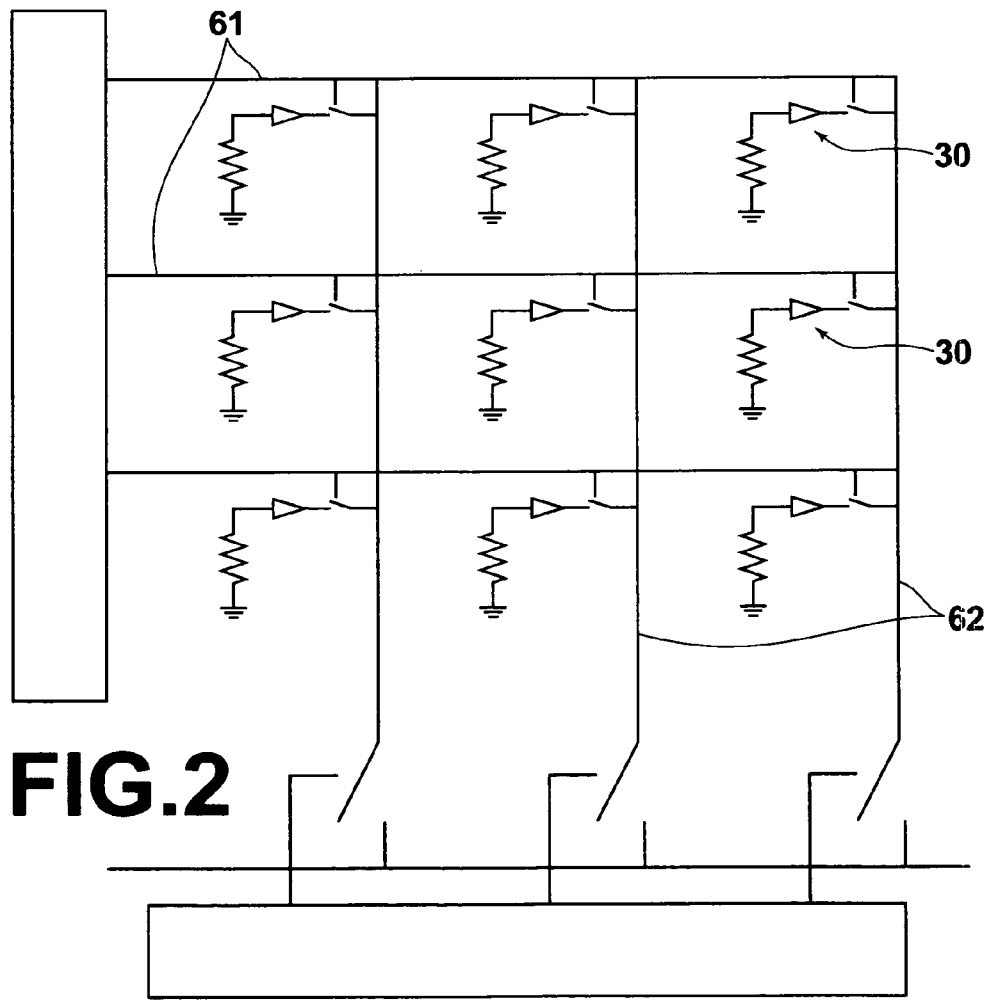
FIG. 2 is a circuit diagram showing a modification of the photo detecting device in accordance with the present invention, which modification has a two-dimensional array structure.

FIG. 2 is a circuit diagram showing a modification of the photo detecting device in accordance with the present invention, which modificationhas a two-dimensional array structure. By way of example, the gate electrode 34 is formed over the entire area of the bottom surface of the p-Si base plate 11, and the n-Si film 12 is formed over the entire area of the top surface of the p-Si base plate 11. Also, the electrical insulator 20 is formed over the entire area of the surface of the n-Si film 12. Further, a plurality of sets of transistor elements, each of which sets contains the source electrode 31, the drain electrode 32, and the channel section 33, are formed in a matrix pattern on the surface of the electrical insulator 20. A plurality of the transistors 30, 30, . . . are thus formed in the matrix pattern. Thereafter, as illustrated in FIG. 2, scanning lines 61, 61, . . . and data lines 62, 62, . . . are connected to the transistors 30, 30, . . . . In this manner, the photo detecting device having the two-dimensional array structure is capable of being obtained.

The photo detecting device having the two-dimensional array structure as described above is capable of being utilized as, for example, a high-sensitivity image sensor. With the photo detecting device having the two-dimensional array structure as described above, a plane image is capable of being obtained in the real time basis and with a high sensitivity even under dark field conditions.

Second Embodiment

Figure 3A:
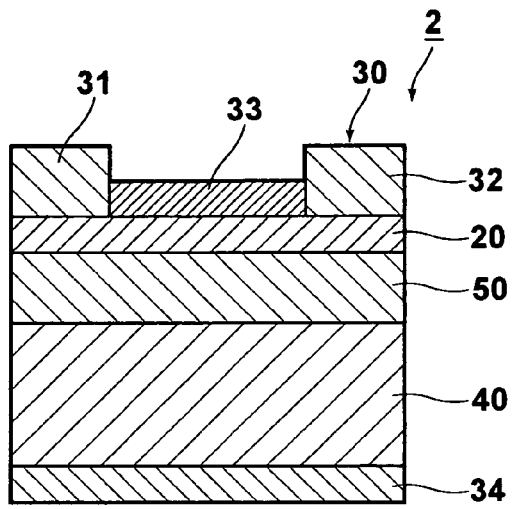
FIG. 3A is a sectional view showing a second embodiment of the photo detecting device in accordance with the present invention.
Figure 3B:
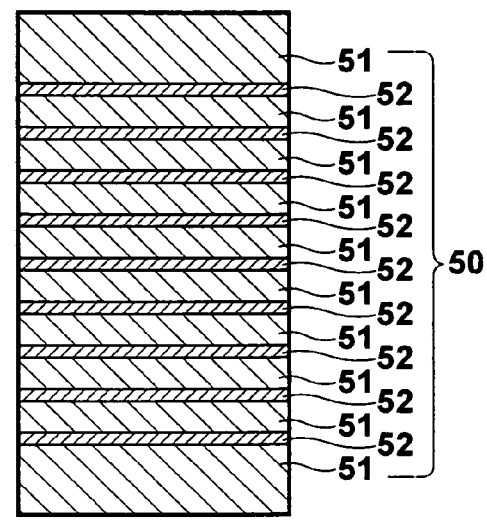
FIG. 3B is an enlarged sectional view showing a part of the photo detecting device of FIG. 3A.

A second embodiment of the photo detecting device in accordance with the present invention will be described herein below with reference to FIGS. 3A and 3B. FIG. 3A is a sectional view showing a second embodiment of the photo detecting device in accordance with the present invention. FIG. 3B is an enlarged sectional view showing a part of the photo detecting device of FIG. 3A. The second embodiment of the photo detecting device in accordance with the present invention has a constitution basically identical with the constitution of the aforesaid first embodiment of the photo detecting device in accordance with the present invention. In FIG. 3A, similar elements are numbered with the same reference numerals with respect to FIG. 1.

In the aforesaid first embodiment, the photo detecting device 1 is provided with the photo-electron generating body 10 constituted of the semiconductor laminate structure body having the pn junction structure. A photo detecting device 2 illustrated in FIG. 3A, which is the second embodiment of the photo detecting device in accordance with the present invention, is provided with a photo-electron generating body 50, which is constituted of a semiconductor laminate structure body having a multiple quantum well structure.

As illustrated in FIG. 3A, the photo-electron generating body 50, which is constituted of the semiconductor laminate structure body having the multiple quantum well structure, is formed on approximately the entire area of the surface of an n-GaAs base plate 40. Also, the electrical insulator 20 is formed on the surface of the photo-electron generating body 50. Further, the source electrode 31, the drain electrode 32, and the channel section 33, which constitute the transistor 30, are formed on the surface of the electrical insulator 20. Furthermore, the gate electrode 34, which constitutes the element of the transistor 30, is formed on approximately the entire area of the back surface of the n-GaAs base plate 40. The photo detecting device 2 has the constitution described above. The constitution of the electrical insulator 20 and the transistor 30 of the photo detecting device 2 is identical with the constitution of the electrical insulator 20 and the transistor 30 of the photo detecting device 1 described above. The source electrode 31 and the drain electrode 32, which constitute the transistor 30 of the photo detecting device 2, are connected with each other via the channel section 33, which is constituted of the nano-tube having the electrically conductive or semi-conductive characteristics.

In lieu of the n-GaAs base plate 40 being employed, a base plate constituted of InP, GaN, GaP, InAs, $Al^2O^3$, SiC, or the like, may be employed.

As illustrated in FIG. 3B, the photo-electron generating body 50 has the multiple quantum well structure, in which AlGaAs barrier layers 51, 51, . . . and GaAs well layers 52, 52, . . . are overlaid alternately. With the photo-electron generating body 50 having the constitution described above, only when the light having a wavelength corresponding to energy between levels determined by the quantum well structure impinges upon the photo-electron generating body 50, the photo-electrons are excited, and the photo-current is generated. With the photo detecting device 2, which is provided with the photo-electron generating body 50 described above, even though an optical filter, or the like, is not utilized, the photo detecting device 2 alone is capable of detecting the light having a specific wavelength.

The combination of the material for the barrier layers and the material for the well layers constituting the photo-electron generating body 50 is not limited to the combination of the material for the AlGaAs barrier layers 51, 51, . . . and the material for the GaAs well layers 52, 52, . . . described above. In accordance with the wavelength of the light to be detected, the combination of the material for the barrier layers and the material for the well layers maybe selected appropriately from combinations of InGaP, AlGaAs, InGaAsP, InP, GaAs, InGaAs, and the like.

This embodiment of the photo detecting device 2 is constituted in the manner described above.

This embodiment of the photo detecting device 2 comprises the photo-electron generating body 50 having the multiple quantum well structure, which photo-electron generating body 50 absorbs the light and generates the photo-electrons. This embodiment of the photo detecting device 2 also comprises the transistor 30, across which the electric current flows in accordance with the quantity of the photo-electrons having been generated by the photo-electron generating body 50. The source electrode 31 and the drain electrode 32 of the transistor 30 are connected with each other via the channel section 33 containing the nano-tube having the electrically conductive or semi-conductive characteristics.

As in the cases of the first embodiment described above, with this embodiment of the photo detecting device 2, a photo-current, which is larger than the photo-current obtainable with the avalanche photodiode (the APD), is capable of being obtained. This embodiment of the photo detecting device 2 has a high sensitivity and is capable of accurately detecting weak light, which could not be detected with the conventional techniques. Also, as in the cases of the first embodiment described above, this embodiment of the photo detecting device 2 has the advantages over the photomultiplier, which utilizes the vacuum tube, in that the photo detecting device 2 has a high flexibility of the designing of the constituent layers and the electrodes and is capable of coping with the formation of the two-dimensional array structure.

Also, with this embodiment of the photo detecting device 2, wherein the photo-electron generating body 50 is constituted of the semiconductor laminate structure body having the multiple quantum well structure, the photo detecting device 2 alone is capable of detecting the light having the specific wavelength and is capable of being utilized appropriately as a sensor, or the like, which is required to have a high sensitivity and to be free from erroneous operations.

(Design Modifications)

The photo detecting device in accordance with the present invention is not limited to the embodiments described above and may be embodied in various other ways.

The aforesaid first embodiment is provided with the photo-electron generating body 10 having the pn junction structure, and the aforesaid second embodiment is provided with the photo-electron generating body 50 having the multiple quantum well structure. Alternatively, the photo-electron generating body may have one of various other structures capable of absorbing the light and exciting the photo-electrons. Examples of the photo-electron generating bodies having structures other than the pn junction structure and the multiple quantum well structure include a photo-electron generating body constituted of a semiconductor laminate structure body having a pin junction structure, and a photo-electron generating body constituted of a semiconductor laminate structure body having a quantum dot structure.

Also, one of the aforesaid embodiments and the technique described in, for example, Japanese Unexamined Patent Publication No. 5(1993)-029647 may be combined with each other. Specifically, an avalanche multiplying layer may be located between the photo-electron generating body 10 or the photo-electron generating body 50 and the transistor 30. In such cases, a photo-current having an intensity enhanced even further is capable of being obtained.

EXAMPLES

The present invention will further be illustrated by the following non-limitative examples.

Example 1

The aforesaid first embodiment of the photo detecting device 1 was produced. Conditions for the production were set as described below.
p-Si Base plate 11: dopant B, dopant concentration $1 \times 10^{18}$ $cm^{-3}$, thickness 100 μm
n-Si Film 12: dopant P, dopant concentration $5 \times 10^{17}$ $cm^{-3}$, thickness 200 nm, film formation with epitaxial growth
Electrical insulator 20: $SiO_2$ film, thickness 100 nm, film formation with CVD technique
Source electrode 31 and drain electrode 32: SiC/Au composite material
Channel section 33: a single carbon nano-tube (diameter 2 nm, length 500 μm) having semi-conductive characteristics and taking on the form located so as to form a bridge across the source electrode 31 and the drain electrode 32
Gate electrode 34: Ti/Pt/Au composite material Comparative Example 1

A commercially available avalanche photodiode (APD) (SiAPDS9251, supplied by Hamamatsu Photonics K.K.) was subjected to evaluation as a photo detecting device for comparison.
(Evaluation)
With respect to each of the photo detecting device having been produced in Example 1 and the photo detecting device of Comparative Example 1, the photo-current was measured with the incident light intensity being set at various different values. The results of the evaluation as illustrated in FIG. 4 were obtained.

Figure 4:
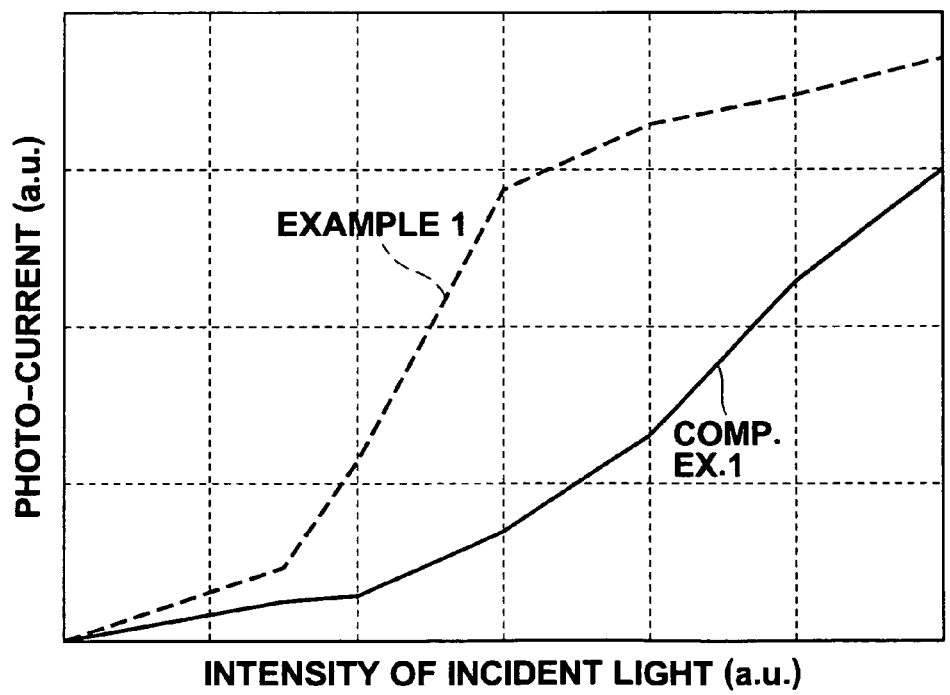
FIG. 4 is a graph showing results of evaluation made on a photo detecting device produced in Example 1 and a photo detecting device for comparison in Comparative Example 1.

As illustrated in FIG. 4, with the photo detecting device having been produced in Example 1, the photo-current larger than the photo-current obtainable with the APD of Comparative Example 1 was obtained. It was thus confirmed that the photo detecting device in accordance with the present invention is a photo detecting device having a sensitivity higher than the sensitivity of the APD and capable of detecting weak light with a high accuracy.

INDUSTRIAL APPLICABILITY

The photo detecting device in accordance with the present invention is capable of being utilized in the fields of optical communication, medical treatment, bio-technology, security, and the like.

What is claimed is:
1. A photo detecting device, comprising:
i) a photo-electron generating body, which absorbs light and generates photo-electrons, and
ii) a transistor, across which an electric current flows in accordance with a quantity of the photo-electrons having been generated by the photo-electron generating body,
an electrical insulator being formed on a surface of the photo-electron generating body,
the transistor being provided with a source electrode and a drain electrode, which are formed on the electrical insulator having been formed on the surface of the photo-electron generating body,
the source electrode and the drain electrode of the transistor being connected with each other via a channel section containing a nano-tube having electrically conductive or semi-conductive characteristics.

2. A device as defined in claim 1 wherein the photo-electron generating body is constituted of a semiconductor laminate structure body having a structure selected from the group consisting of a pn junction structure, a pin junction structure, a multiple quantum well structure, and a quantum dot structure.

3. A device as defined in claim 1 wherein the nano-tube constituting the channel section contains at least one kind of substance selected from the group consisting of carbon, boron nitride, and silicon.

4. The device as defined in claim 1, wherein the nano-tube comprises one of boron nitride and silicon.

5. The device as defined in claim 1, wherein the photo-electron generating body comprises one of a pin junction structure, a multiple quantum well structure, and a quantum dot structure.

6. The device as defined in claim 1, wherein the photo-electron generating body comprises a P layer to receive light and an N layer disposed proximate to the insulator to output the photo-electrons, wherein the N layer is disposed over substantially entire surface of the P layer.

7. The device as defined in claim 1, wherein the photo-electron generating body comprises a P layer to receive light and an N layer disposed proximate to the insulator to output the photo-electrons, wherein the N layer is disposed over entire surface of the P layer.

8. A photo detecting device, comprising:
a photo-electron generating body which photo-electron generating body absorbs light and generates photo-electrons;
an insulating layer disposed proximate a first surface of the photo-electron generating body; and
a transistor disposed on the insulating layer, across which transistor an electric current flows in accordance with a quantity of the photo-electrons generated by the photo-electron generating body, the transistor comprising:
a gate disposed proximate a second surface of the photo-electron generating body, which second surface is opposing the first surface, the light impinging on the gate and being transmitted to the photo-electron generating body,
a source electrode,
a drain electrode, and
a channel section comprising a nano-tube having electrically conductive or semi-conductive characteristics, which nano-tube electrically couples the source and drain electrodes.

9. The photo detecting device according to claim 8, wherein the photo-electron generating body comprises a P layer disposed on the gate to receive light and an N layer disposed on the P layer to output photo-electrons.

10. The photo detecting device according to claim 8, wherein the photo-electron generating body comprises:
a multiple quantum well structure comprising alternatively overlaid barrier layers and well layers.

11. The photo detecting device according to claim 8, wherein the photo-electron generating body is directly disposed on the gate.

12. The photo detecting device according to claim 8, wherein the channel section is disposed as a conductive material between the source and drain electrodes, the channel section having a smaller physical height than the source and drain electrodes.

* * * * *